United States Patent
Lee et al.

(10) Patent No.: US 10,580,883 B2
(45) Date of Patent: Mar. 3, 2020

(54) 1-1 FIN FORCED STACK INVERTER

(71) Applicant: UNITED MICROELECTRONICS CORP., Hsin-Chu (TW)

(72) Inventors: Kuo-Hsing Lee, Hsinchu County (TW); Yi-Chung Sheng, Tainan (TW); Sheng-Yuan Hsueh, Tainan (TW); Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/912,526

(22) Filed: Mar. 5, 2018

(65) Prior Publication Data
US 2019/0252518 A1    Aug. 15, 2019

(30) Foreign Application Priority Data

Feb. 9, 2018 (TW) .............................. 107104758 A

(51) Int. Cl.
| | | |
|---|---|---|
| *H01L 29/66* | (2006.01) | |
| *H01L 29/78* | (2006.01) | |
| *H01L 27/092* | (2006.01) | |
| *H01L 21/8238* | (2006.01) | |
| *H01L 21/8234* | (2006.01) | |
| *H01L 27/088* | (2006.01) | |
| *H01L 27/12* | (2006.01) | |
| *H01L 21/84* | (2006.01) | |

(52) U.S. Cl.
CPC .. *H01L 29/6681* (2013.01); *H01L 21/823431* (2013.01); *H01L 21/823821* (2013.01); *H01L 27/0886* (2013.01); *H01L 27/0924* (2013.01); *H01L 29/7851* (2013.01); *H01L 21/845* (2013.01); *H01L 27/1211* (2013.01)

(58) Field of Classification Search
CPC ............. H01L 29/6681; H01L 29/7851; H01L 27/0924
See application file for complete search history.

(56) References Cited

U.S. PATENT DOCUMENTS

| | | | | |
|---|---|---|---|---|
| 7,829,951 | B2 * | 11/2010 | Song ...................... | H01L 29/785 257/365 |
| 7,994,583 | B2 * | 8/2011 | Inaba ..................... | G11C 11/412 257/369 |
| 9,070,742 | B2 * | 6/2015 | Xie ..................... | H01L 21/76224 |
| 9,105,510 | B2 * | 8/2015 | Woo ..................... | H01L 21/3086 |
| 9,105,685 | B2 * | 8/2015 | Lin ..................... | H01L 21/76224 |
| 9,508,727 | B2 * | 11/2016 | Park ................. | H01L 21/823828 |
| 9,515,184 | B2 * | 12/2016 | Chiang ................. | H01L 29/785 |
| 9,679,815 | B2 * | 6/2017 | Lee ................. | H01L 21/823431 |
| 9,812,435 | B2 | 11/2017 | Okagaki | |
| 9,825,173 | B2 * | 11/2017 | Lin ................... | H01L 29/66795 |

(Continued)

*Primary Examiner* — Ida M Soward
(74) *Attorney, Agent, or Firm* — Winston Hsu

(57) ABSTRACT

A method of forming a fin forced stack inverter includes the following steps. A substrate including a first fin, a second fin and a third fin across a first active area along a first direction is provided, wherein the first fin, the second fin and the third fin are arranged side by side. A fin remove inside active process is performed to remove at least a part of the second fin in the first active area. A first gate is formed across the first fin and the third fin in the first active area along a second direction. The present invention also provides a 1-1 fin forced fin stack inverter formed by said method.

5 Claims, 7 Drawing Sheets

(56) References Cited

U.S. PATENT DOCUMENTS

| | | | | |
|---|---|---|---|---|
| 9,966,376 B2* | 5/2018 | Kim | ................... | H01L 27/0924 |
| 10,109,720 B1* | 10/2018 | Yin | ................... | H01L 21/3085 |
| 10,229,911 B2* | 3/2019 | Yoon | ................... | H01L 27/0924 |
| 10,269,907 B2* | 4/2019 | Li | ....................... | H01L 29/0649 |
| 2013/0196508 A1* | 8/2013 | LiCausi | .......... | H01L 21/823821 |
| | | | | 438/696 |
| 2013/0206371 A1* | 8/2013 | Fujita | ................... | H01L 23/473 |
| | | | | 165/104.28 |
| 2015/0187582 A1* | 7/2015 | Ueda | .................. | H01L 21/2236 |
| | | | | 438/513 |
| 2015/0303196 A1* | 10/2015 | Kawa | ................. | H01L 27/0207 |
| | | | | 257/401 |
| 2016/0005738 A1* | 1/2016 | Liu | .................... | H01L 27/0924 |
| | | | | 257/369 |
| 2016/0056161 A1* | 2/2016 | Hong | .................. | H01L 27/1104 |
| | | | | 257/401 |
| 2016/0155804 A1* | 6/2016 | Oh | .................... | H01L 29/66477 |
| | | | | 257/369 |
| 2016/0197017 A1* | 7/2016 | Ju | .................... | H01L 21/823821 |
| | | | | 257/369 |
| 2016/0254190 A1* | 9/2016 | Hsieh | ................ | G06F 17/5072 |
| | | | | 438/283 |
| 2016/0307767 A1* | 10/2016 | Lee | ................... | H01L 29/66795 |
| 2016/0307802 A1* | 10/2016 | Lee | ................ | H01L 21/823431 |
| 2017/0092728 A1* | 3/2017 | Kim | .................. | H01L 29/41791 |
| 2017/0194324 A1* | 7/2017 | You | ................ | H01L 21/823431 |
| 2017/0352650 A1* | 12/2017 | Azmat | ............. | H01L 27/11807 |
| 2018/0033890 A1* | 2/2018 | Park | ................... | H01L 27/0886 |
| 2018/0114791 A1* | 4/2018 | Kim | .................. | H01L 27/0924 |
| 2018/0166432 A1* | 6/2018 | Won | .................... | H01L 23/5286 |
| 2018/0277547 A1* | 9/2018 | Park | ................ | H01L 21/823828 |
| 2018/0342508 A1* | 11/2018 | Kim | .................. | H01L 27/0886 |
| 2019/0097035 A1* | 3/2019 | Lin | .................... | H01L 21/0228 |
| 2019/0229197 A1* | 7/2019 | Li | .................. | H01L 21/823821 |

* cited by examiner

1-1 FIN FORCED STACK INVERTER

BACKGROUND OF THE INVENTION

1. Field of the Invention

The present invention relates generally to a fin forced stack inverter and forming method thereof, and more specifically to a 1-1 fin forced stack inverter and method of forming fin forced stack inverter.

2. Description of the Prior Art

MOSFETs (Metal Oxide Semiconductor Field Effect Transistor) are major components of LSI (Large Scale Integration) using silicon in recent years. While this reduction in the dimension of the MOSFET has been advanced along the scaling rule, various problems have appeared as a generation of a device has been advanced, and it is difficult to achieve both of suppression of a short channel effect of the MOSFET and securement of a high current drive power. Therefore, research and development of a new structure that can enhance the integration of the MOSFETs in LSI have actively advanced.

SUMMARY OF THE INVENTION

The present invention provides a 1-1 fin forced stack inverter and method of forming fin forced stack inverter, which removes a part of fin structures in an active area, so that the fin forced stack inverter can be formed in the active area with a smaller surface area.

The present invention provides a method of forming a fin forced stack inverter including the following steps. A substrate including a first fin, a second fin and a third fin across a first active area along a first direction is provided, wherein the first fin, the second fin and the third fin are arranged side by side. A fin remove inside active process is performed to remove at least a part of the second fin in the first active area. A first gate is formed across the first fin and the third fin in the first active area along a second direction.

The present invention provides a 1-1 fin forced stack inverter including a substrate and a first gate. The substrate includes a first fin and a third fin across a first active area along a first direction, and a fourth fin and a sixth fin across a second active area along the first direction, wherein the first fin, the third fin, the fourth fin and the sixth fin are arranged side by side. The first gate is across the first fin and the third fin in the first active area and across the fourth fin and the sixth fin in the second active area along a second direction.

According to the above, the present invention provides a 1-1 fin forced stack inverter and method of forming fin forced stack inverter, which forms a plurality of fins in a substrate, wherein the fins include a first fin, a second fin and a third fin across a first active area along a first direction, and then performs a fin remove inside active process to remove the second fin in the first active area. Thereafter, a first gate is formed across these fins. In this way, the formed 1-1 fin forced stack inverter can be formed in an active area with a smaller surface area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
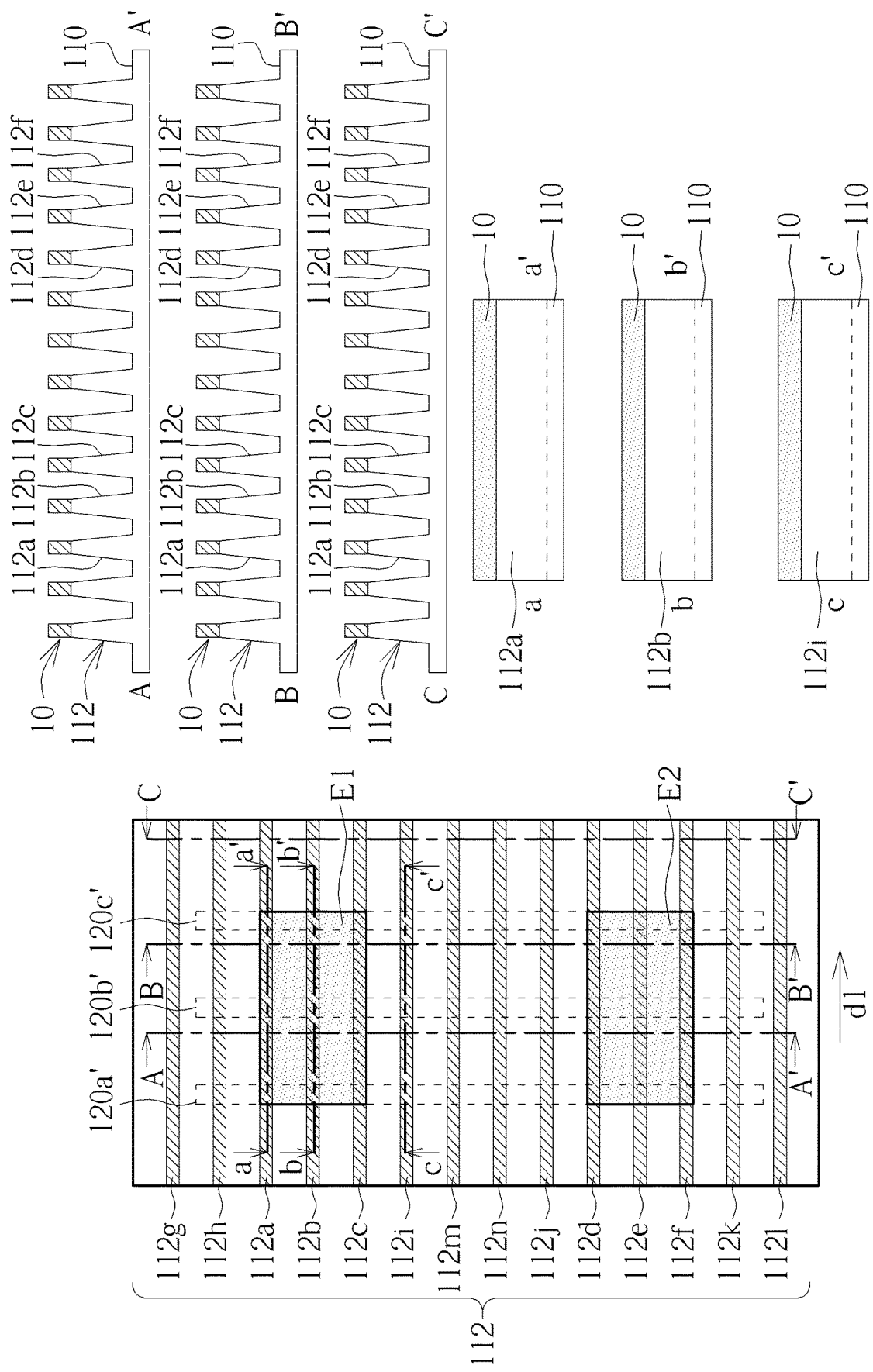
FIG. 1 schematically depicts a top view and a cross-sectional view of a method of forming a fin forced stack inverter according to an embodiment of the present invention.

FIGS. 1-5 schematically depict top views and cross-sectional views of a method of forming a fin forced stack inverter according to an embodiment of the present invention, wherein the left diagrams of FIGS. 1-5 show top views of a method of forming a fin forced stack inverter, and the right diagrams of FIGS. 1-5 show cross-sectional views of a method of forming a fin forced stack inverter alone line AA', line BB', line CC', line aa', line bb' and line cc' of the left diagrams of FIGS. 1-5 respectively. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. The substrate 110 may include a plurality of fin structures 112 along a first direction d1 and arranged side by side, wherein the fin structures 112 may include a first fin 112$a$, a second fin 112$b$ and a third fin 112$c$ across a first active area E1, and a fourth fin 112$d$, a fifth fin 112$e$ and a sixth fin 112$f$ across a second active area E2. The fin structures 112 may include a plurality of dummy fins 112$g$/112$h$/112$i$/112$j$/112$k$/112$l$/112$m$/112$n$ along the first direction d1 outside the first active area E1 and the second active area E2, and the number of the dummy fins 112$g$/112$h$/112$i$/112$j$/112$k$/112$l$/112$m$/112$n$ may be one or more. A plurality of gates are formed in later processes, and dotted lines are depicted for representing the relative locations 120$a$'/120$b$'/120$c$' of the gates and the first active area E1, the second active area E2 and the fin structures 112. Methods of forming the fin structures 112 may include forming a mask layer 10 by depositing and patterning, and an exposed part of the substrate 110 is etched to form the fin structures 112, but it is not limited thereto.

Figure 2:
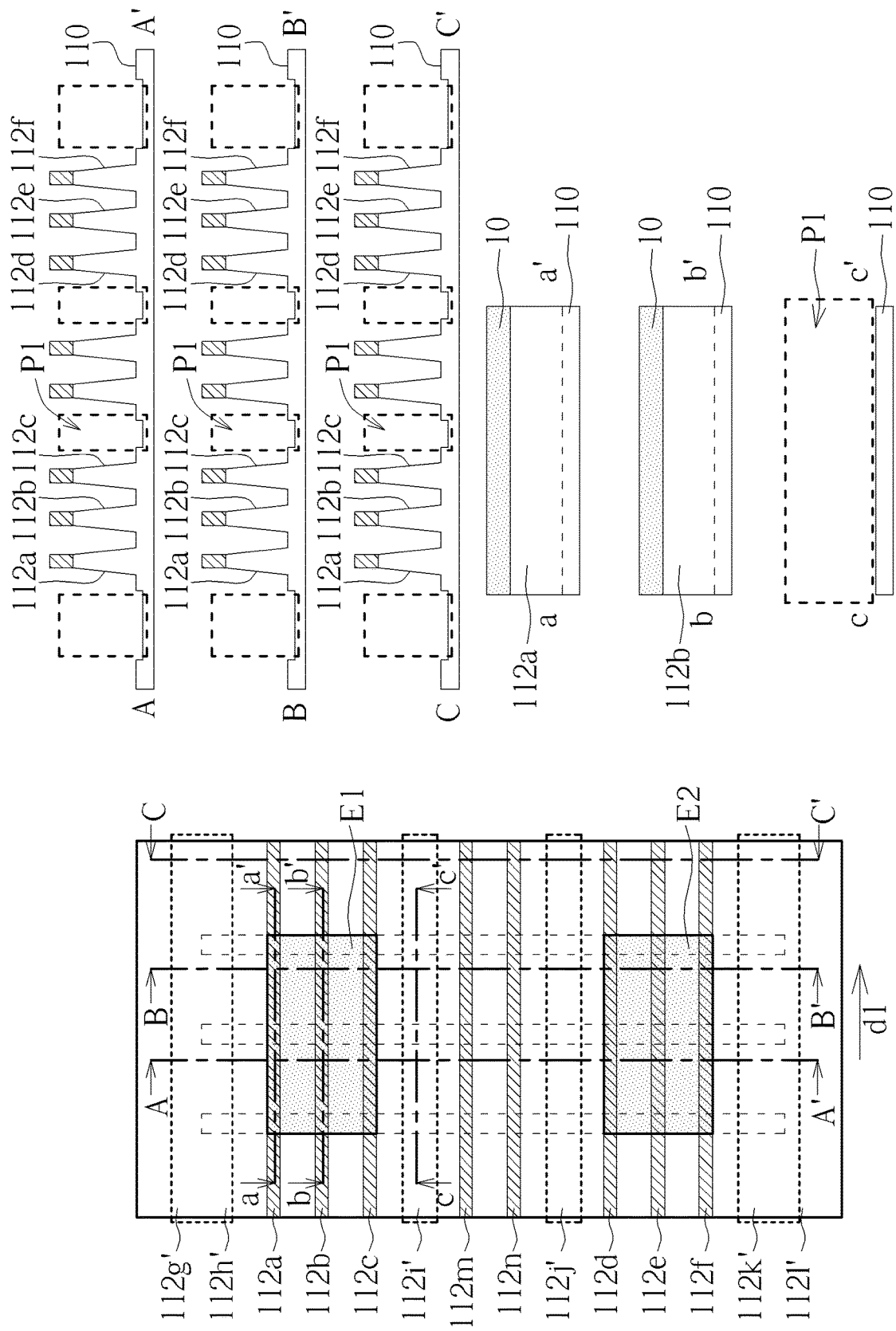
FIG. 2 schematically depicts a top view and a cross-sectional view of a method of forming a fin forced stack inverter according to an embodiment of the present invention.

As shown in FIG. 2, a fin remove outside active process P1 is performed to remove six dummy fins 112$g$/112$h$/112$i$/112$j$/112$k$/112$l$ completely. In one case, a part of the substrate 110 is removed while the fin remove outside active process P1 is performed, so that fin slots 112g'/112h'/112i'/112j'/112k'/112l' are formed below the locations of the dummy fins 112g/112h/112i/112j/112k/112l, but it is not limited thereto. The dotted line part represents the removing area of the fin remove outside active process P1, meaning the areas of the dummy fins 112g/112h/112i/112j/112k/112l outside the first active area E1 and the second active area E2. In this embodiment, the dummy fins 112g/112h/112i/112j/112k/112l are cut along the first direction d1 by the fin remove outside active process P1.

Figure 3:
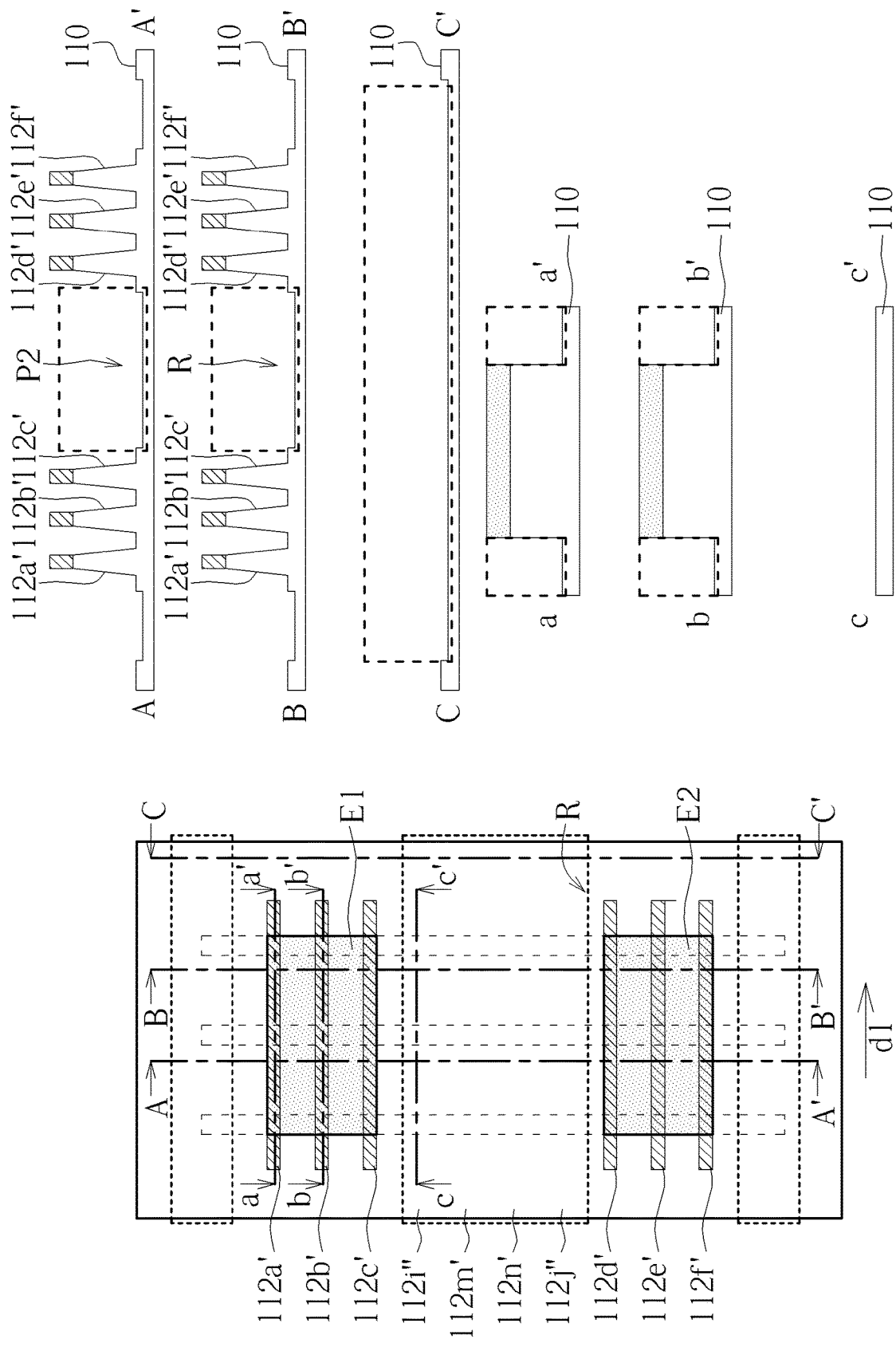
FIG. 3 schematically depicts a top view and a cross-sectional view of a method of forming a fin forced stack inverter according to an embodiment of the present invention.

As shown in FIG. 3, after the fin remove outside active process P1 is performed, a fin cutting process P2 is performed to remove a part of the first fin 112a, a part of the second fin 112b, a part of the third fin 112c, a part of the fourth fin 112d, a part of the fifth fin 112e, and a part of the sixth fin 112f. In a preferred embodiment, the fin structures 112 outside the first active area E1 and the second active area E2 and surrounding the first active area E1 and the second active area E2 are also cut by the fin cutting process P2. In this case, due to the dummy fins 112g/112h/112i/112j/112k/112l being removed while performing the fin remove outside active process P1, only the dummy fins 112m/112n removed while performing the fin cutting process P2. Therefore, a part of a first fin 112a', a part of a second fin 112b', a part of a third fin 112c' across the first active area E1, and a part of a fourth fin 112d', a part of a fifth fin 112e', a part of a sixth fin 112f' across the second active area E2 remain, and fin slots 112i''/112j''/112m'/112n' are formed. In other words, at least a fin slot R is formed between the first active area E1 and the second active area E2 along the first direction d1 while performing the fin cutting process P2. Or, the fin slots R surround the first active area E1 and the second active area E2 are formed. Dotted line parts of FIG. 3 represent the cutting area of the fin cutting process P2 outside the first active area E1 and the second active area E2. The cutting area partially overlaps the removing area of the fin remove outside active process P1.

Figure 4:
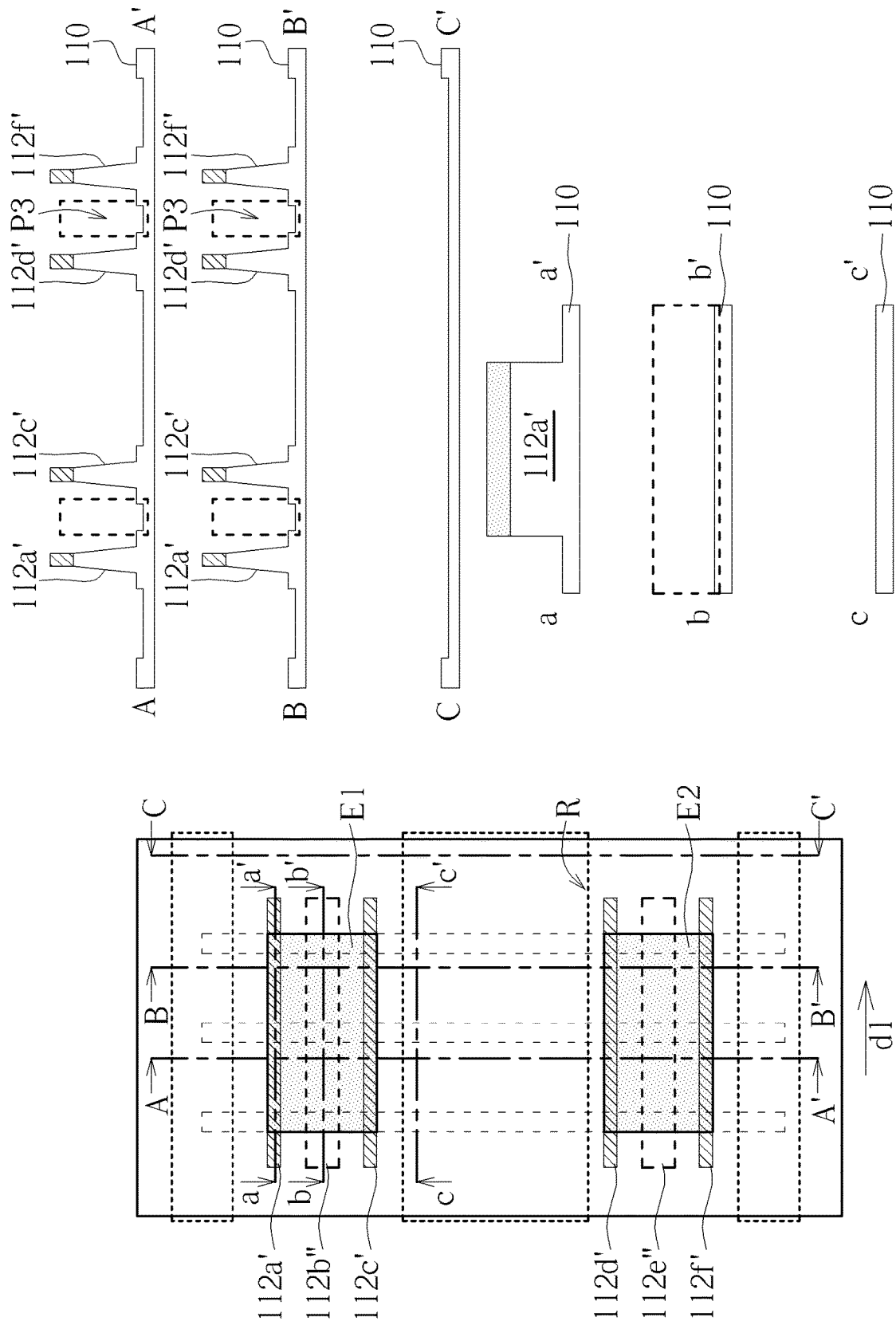
FIG. 4 schematically depicts a top view and a cross-sectional view of a method of forming a fin forced stack inverter according to an embodiment of the present invention.

As shown in FIG. 4, a fin remove inside active process P3 is performed to remove the second fin 112b' in the first active area E1 and the fifth fin 112e' in the second active area E2, and thus a second fin slot 112b'' is formed between the first fin 112a' and the third fin 112c' in the first active area E1, a fifth fin slot 112e'' is formed between the fourth fin 112d' and the sixth fin 112f' in the second active area E2. In this case, the fins are cut only along the first direction d1 by the fin remove inside active process P3, but it is not limited thereto.

Figure 5:
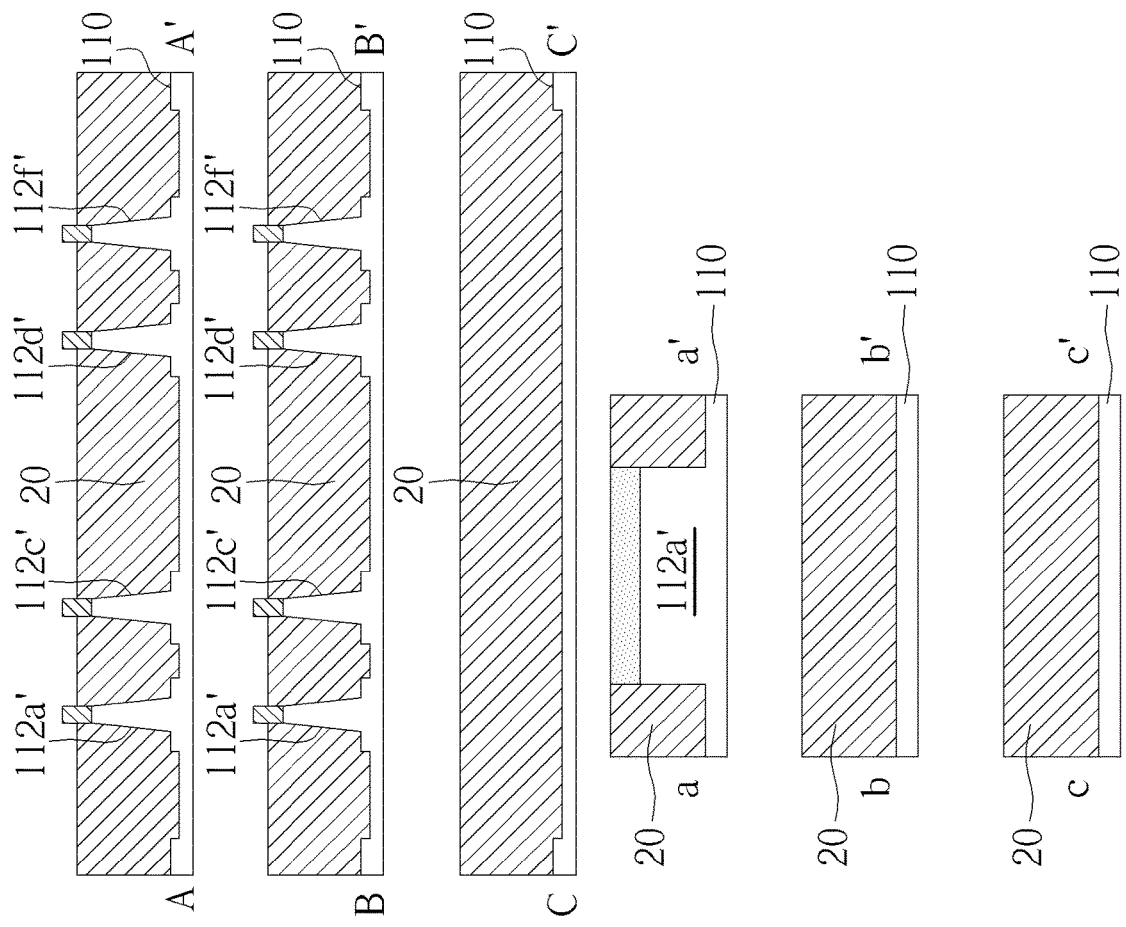
FIG. 5 schematically depicts a top view and a cross-sectional view of a method of forming a fin forced stack inverter according to an embodiment of the present invention.

As shown in FIG. 5, after the fin remove inside active process P3 is performed, filling an isolation structure 20 between the first fin 112a', the third fin 112c', the fourth fin 112d' and the sixth fin 112f'. Therefore, the isolation structure 20 fills between the first active area E1 and the second active area E2. The isolation structure 20 may be a shallow trench isolation (STI) structure, and may be formed by a shallow trench isolation (STI) process, but it is not limited thereto.

Figure 6:
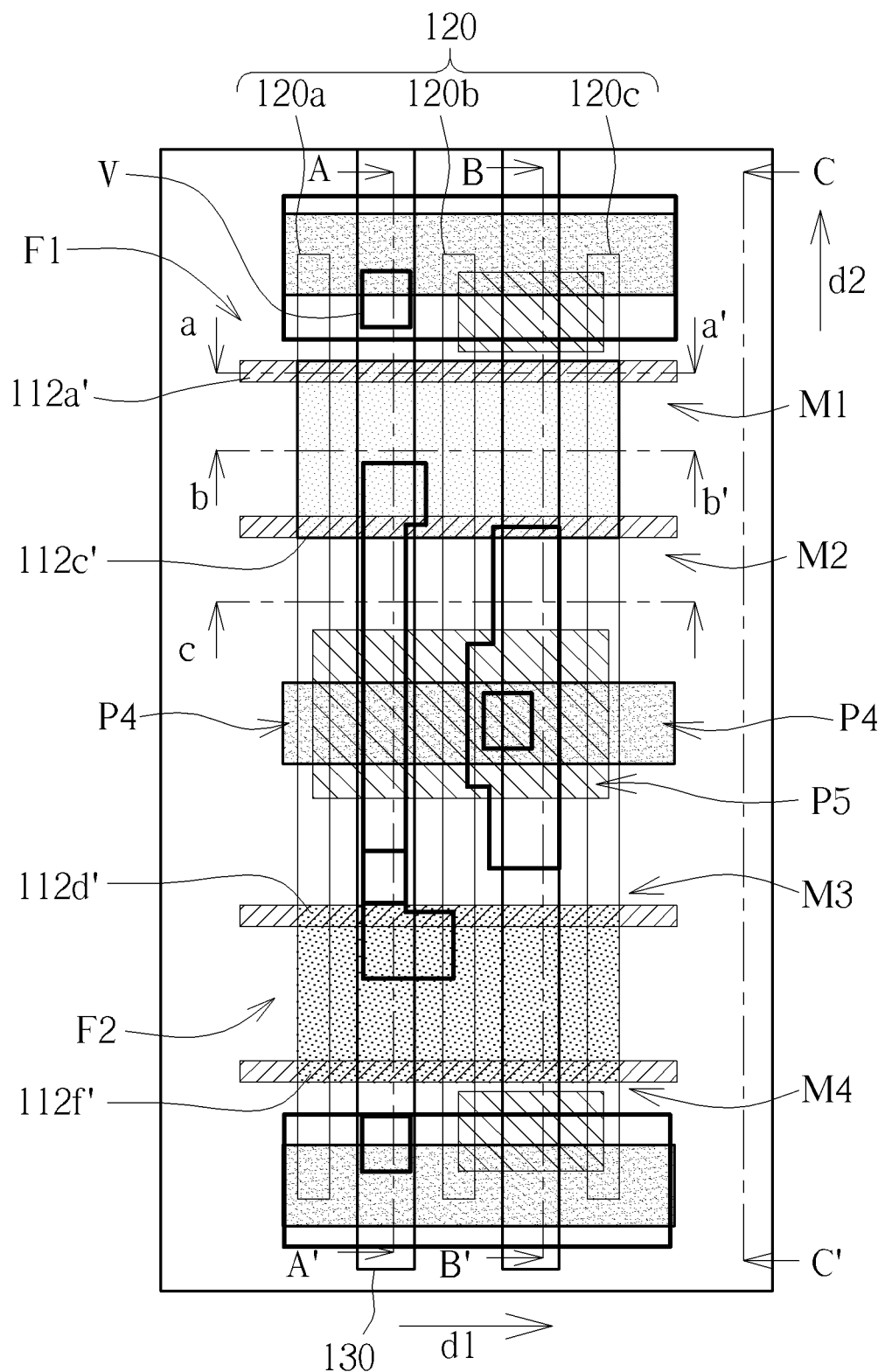
FIG. 6 schematically depicts a top view of a 1-1 fin forced stack inverter according to an embodiment of the present invention.

Above all, a 1-1 fin forced stack inverter is formed in the first active area E1 and the second active area E2 respectively by applying the fin remove inside active process P3 of the present invention. FIG. 6 schematically depicts a top view of a 1-1 fin forced stack inverter according to an embodiment of the present invention. As shown in FIG. 6, after filling the isolation structure 20, a first gate 120 is formed across the first fin 112a' and the third fin 112c' in the first active area E1 along the second direction d2 and across the fourth fin 112d' and the sixth fin 112f' in the second active area E2 along the second direction d2. Thereafter, a gate cutting process P4 may be performed to cut the first gate 120 connecting the 1-1 forced stack inverter F1 and the 1-1 forced stack inverter F2. A metal interconnect 130 is formed and then a metal interconnect cutting process P5 may be performed to cut the metal interconnect 130 between the 1-1 forced stack inverter F1 and the 1-1 forced stack inverter F2. Thereafter, vias V may be formed in the metal interconnect 130, and then later processes may be performed, which are not described. Therefore, the first fin 112a' includes a fin of a first FINFET M1, the third fin 112c' includes a fin of a second FINFET M2, the fourth fin 112d' includes a fin of a third FINFET M3, and the sixth fin 112f' includes a fin of a fourth FINFET M4. Preferably, the first FINFET M1 and the second FINFET M2 have a first conductive type, the third FINFET M3 and the fourth FINFET M4 have a second conductive type, and the first conductive type is different from the second conductive type, but it is not limited thereto.

Figure 7:
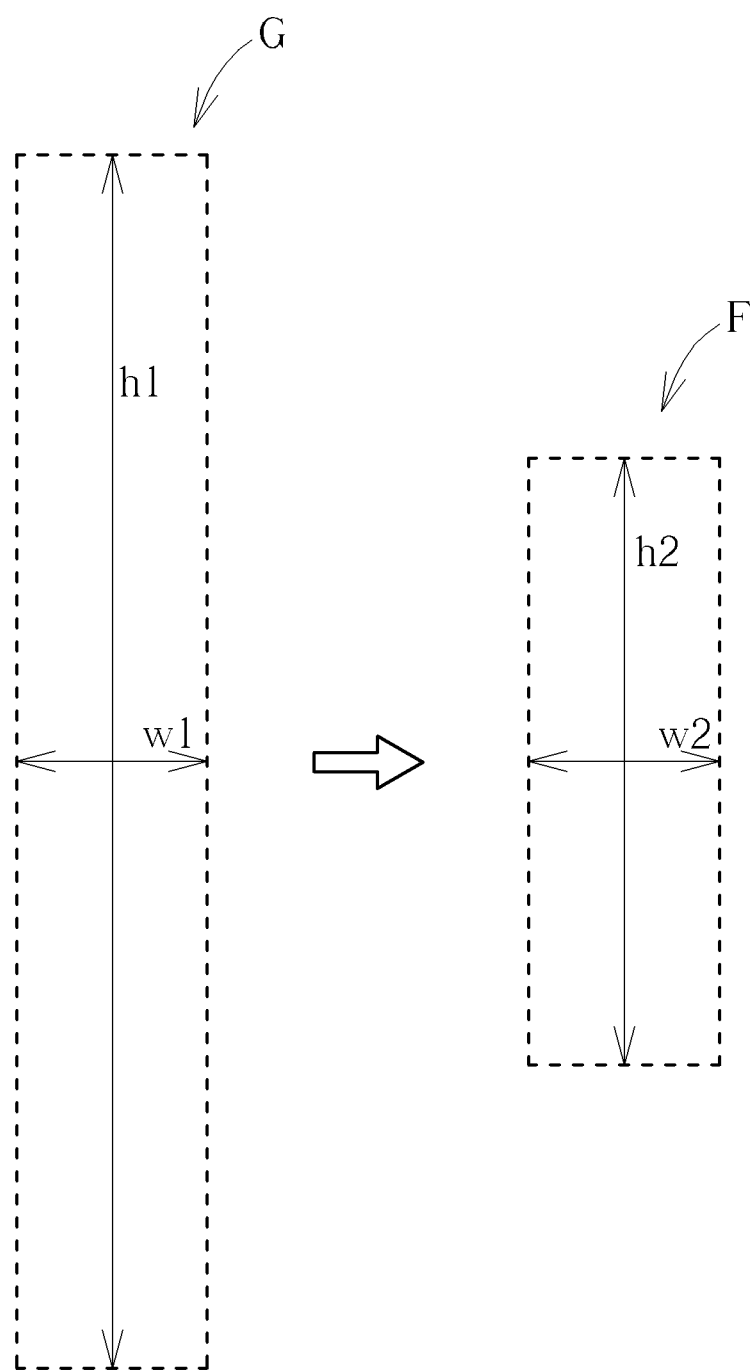
FIG. 7 schematically depicts the surface area of a 1-1 fin forced stack inverter according to an embodiment of the present invention.

FIG. 7 schematically depicts the surface area of a 1-1 fin forced stack inverter according to an embodiment of the present invention. As shown in FIG. 7, the left diagram is a surface area of a current 1-1 fin forced stack inverter G, which has a surface area having a height h1 such as 1152 nanometers and a width w1 such as 180 nanometers, and the current 1-1 fin forced stack inverter G can be shrank to a 1-1 fin forced stack inverter F, which has a surface area having a height h2 such as 576 nanometers and a width w2 such as 180 nanometers, but it is not limited thereto.

To summarize, the present invention provides a 1-1 fin forced stack inverter and method of forming fin forced stack inverter, which forms a plurality of fin structures in a substrate, wherein the fin structures includes a first fin, a second fin and a third fin across a first active area along a first direction, and then performs a fin remove inside active process to remove the second fin in the first active area. Thereafter, a first gate is formed across these fins. In this way, the formed 1-1 fin forced stack inverter can be formed in an active area with a smaller surface area.

Moreover, before the fin remove inside active process is performed, a fin remove outside active process or/and a fin cutting process may be performed. At least a dummy fin outside the first active area may be removed by the fin remove outside active process. At least a part of the first fin, the second fin and the third fin may be removed by the fin cutting process, or the fins outside and surround the first active area may be removed to achieve a desired fin layout.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A 1-1 fin forced stack inverter, comprising:
a substrate comprising a first fin and a third fin across a first active area along a first direction, and a fourth fin and a sixth fin across a second active area along the first direction, wherein the first fin, the third fin, the fourth fin and the sixth fin are arranged side by side, and the substrate comprising a second fin slot being a rectangular recess at a top view between the first fin and the third fin in the first active area, and a fifth fin slot being a rectangular recess at a top view between the fourth fin and the sixth fin in the second active area; and
a first gate across the first fin and the third fin in the first active area and across the fourth fin and the sixth fin in the second active area along a second direction.

2. The 1-1 fin forced stack inverter according to claim 1, wherein the first fin comprises a fin of a first FINFET, the third fin comprises a fin of a second FINFET, the fourth fin comprises a fin of a third FINFET and the sixth fin comprises a fin of a fourth FINFET.

3. The 1-1 fin forced stack inverter according to claim 2, wherein the first FINFET and the second FINFET have a first conductive type, the third FINFET and the fourth FINFET have a second conductive type, and the first conductive type is different from the second conductive type.

4. The 1-1 fin forced stack inverter according to claim 1, further comprising:
   fin slots surrounding the first active area and the second active area.

5. The 1-1 fin forced stack inverter according to claim 1, further comprising:
   at least a fin slot between the first active area and the second active area along the first direction.

\* \* \* \* \*